US008487698B2

(12) United States Patent
Nakamura et al.

(10) Patent No.: US 8,487,698 B2
(45) Date of Patent: Jul. 16, 2013

(54) AMPLIFIER WITH PASS-THROUGH MODE (71) Applicant: Panasonic Corporation, Osaka (JP)

(72) Inventors: Tsunehiro Nakamura, Osaka (JP);
Naoki Okamoto, Osaka (JP); Maki Shibata, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/737,655

(22) Filed: Jan. 9, 2013

(65) Prior Publication Data

US 2013/0120067 A1 May 16, 2013

Related U.S. Application Data (63) Continuation of application No. PCT/JP2010/006656, filed on Nov. 12, 2010.

(30) Foreign Application Priority Data

Jul. 9, 2010 (JP) .................................. 2010-157166

(51) Int. Cl.
*H03F 1/14* (2006.01)
(52) U.S. Cl.
USPC ............................................ 330/51; 330/285
(58) Field of Classification Search
USPC ............................................ 330/51, 285, 296
See application file for complete search history.

(56) References Cited

U.S. PATENT DOCUMENTS

| 6,891,866 B2 * | 5/2005 | Robinson et al. ........ 372/29.015 |
| 6,904,271 B2 | 6/2005 | Yamamoto |
| 7,936,219 B2 * | 5/2011 | Matsuzuka et al. ........... 330/296 |
| 8,212,605 B2 * | 7/2012 | Horie et al. .................... 327/513 |
| 2002/0158681 A1 | 10/2002 | Yamamoto |

FOREIGN PATENT DOCUMENTS

| JP | 2000-101371 A | 4/2000 |
| JP | 2002-261501 A | 9/2002 |
| JP | 2006-197227 A | 7/2006 |

OTHER PUBLICATIONS

International Search Report issued in International Patent Application No. PCT/JP2010/006656 mailed Jan. 25, 2011.

* cited by examiner

*Primary Examiner* — Henry Choe
(74) *Attorney, Agent, or Firm* — McDermott Will & Emery LLP (57) ABSTRACT

In an amplifier with pass-through mode of the present invention, in a pass-through mode, a signal transmission transistor and a bias control transistor are turned ON and a voltage of an output terminal is maintained in a ground potential via the bias control transistor and a resistor. Thus, a power supply voltage is applied to a control terminal of the signal transmission transistor and one main terminal of the signal transmission transistor is maintained in a ground potential. Therefore, an ON-resistance of the signal transmission transistor is decreased to a minimum level.

9 Claims, 7 Drawing Sheets

AMPLIFIER WITH PASS-THROUGH MODE

This is a continuation application under 35 U.S.C 111(a) of pending prior International Application No. PCT/JP2010/006656, filed on Nov. 12, 2010. The disclosure of Japanese Patent Application No. 2010-157166 filed on Jul. 9, 2010 including specification, drawings and claims are incorporated herein by reference in its entirety.

BACKGROUND OF THE INVENTION

1. Field of the Invention

The present invention relates to an amplifier with pass-through mode.

2. Description of the Related Art

An amplifier built into an input device or the like of a radio communication device typically has a function for switching to a high gain or to a low gain according to an electric field intensity of a received radio frequency (RF) signal. Specifically, the amplifier executes an amplification mode for amplifying the received RF signal with a normal amplification factor in the case where the radio communication device is used in a region (weak electric field region) in which the electric field intensity of the received RF signal is weak, while the amplifier executes a pass-through mode for amplifying the received RF signal with an amplification factor lower than the normal amplification factor in the case where the radio communication device is used in a region (intense electric field region) in which the electric field intensity of the received RF signal is high. The amplifier capable of switching between the amplification mode and the pass-through mode according to the electric field intensity of the received RF signal is referred to as an amplifier with pass-through mode.

Figure 7:
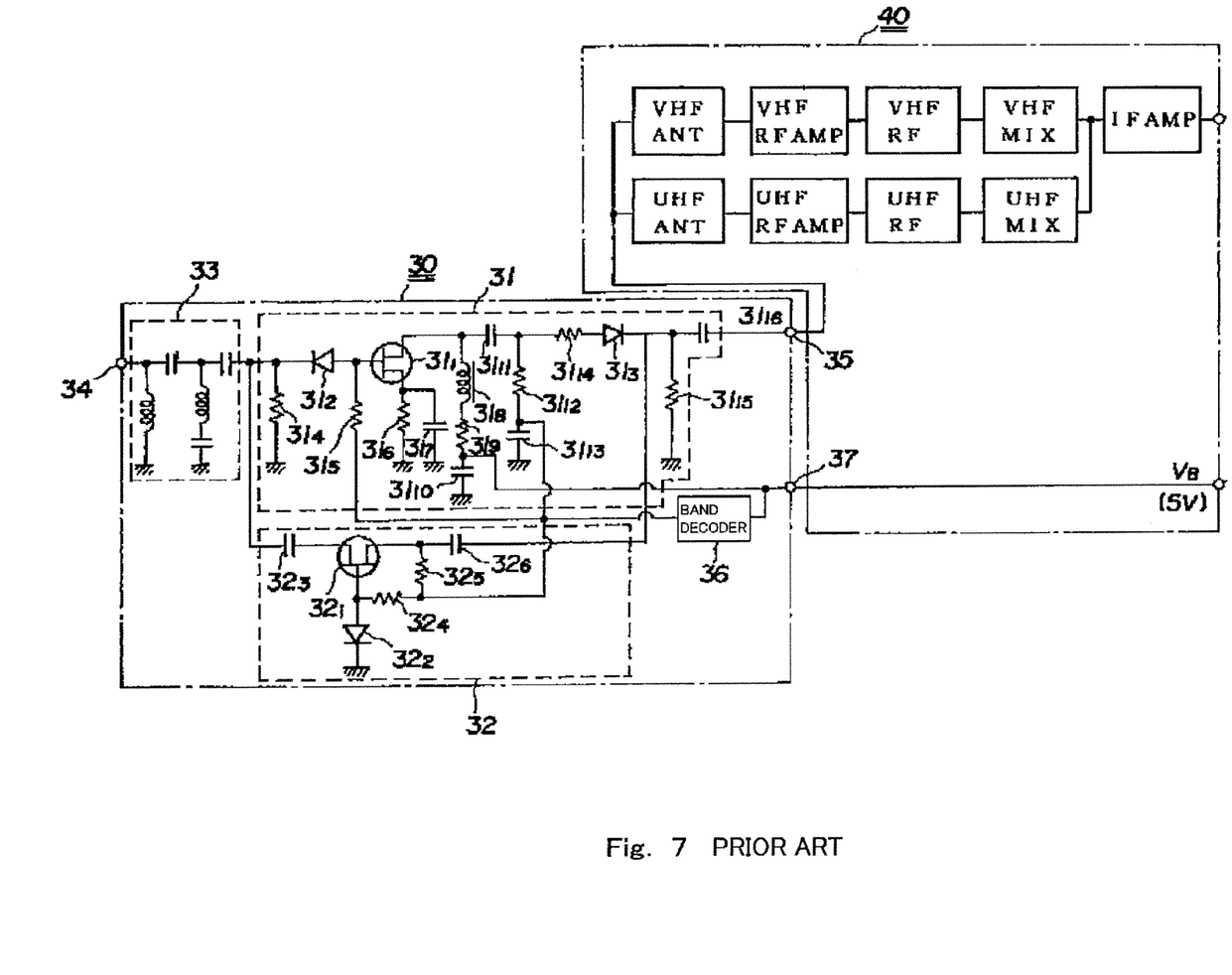
FIG. 7 is a circuit diagram showing a configuration of a conventional RF signal switching circuit.

Referring to FIG. 7, a RF signal switching circuit disclosed in Japanese Laid-Open Patent Application Publication No. 2002-261501 is shown. In a case where a television tuner 40 is used in the weak electric field region, the amplification mode is selected, and an operation mode is set so that a voltage VB1 (e.g., 5V) equal to a power supply voltage is output from an output end of a band decoder 36. That is, a first RF signal path 31 is active, while a second RF signal path 32 is inactive. More specifically, a RF signal with a low level is fed to a RF signal input terminal 34 and then fed to an amplification field effect transistor 311 via a first diode 312 in an ON-state. The amplification field effect transistor 311 amplifies the RF signal up to a predetermined level, and then feeds the amplified RF signal to a RF signal output terminal 35 via a second diode 313 in an ON-state. At this time, a signal transmission transistor 321 is OFF, and the RF signal is not transmitted to the RF signal output terminal 35 via the signal transmission transistor 321.

SUMMARY OF THE INVENTION

On the other hand, in a case where the television tuner 40 is used in the intense electric field region, the pass-through mode is selected, and the operation mode is set so that a voltage VE (e.g., 0V) equal to a ground voltage is output from the output end of the band decoder 36. That is, the first RF signal path 31 is inactive, while the second RF signal path 32 is active. More specifically, a RF signal with a high level is fed to the RF signal input terminal 34 and then fed to the RF signal output terminal 35 via the signal transmission transistor 321 in an ON-state. At this time, the first diode 312 and the second diode 313 are OFF and the amplification field effect transistor 311 is inactive. Therefore, the RF signal is not transmitted to the RF signal output terminal 35 via the amplification field effect transistor 311.

In many cases, in design of the radio communication device such as the RF signal switching circuit of FIG. 7, radio standards cannot be satisfied unless a passing characteristic is set high.

This will be described in detail in conjunction with the configuration of FIG. 7. In the pass-through mode, a gain of the RF signal switching circuit is higher as an ON-resistance of the signal transmission transistor 321 included in the second RF-signal path 32 is smaller. Therefore, to increase the gain of the RF signal switching circuit, it is necessary to decrease the ON-resistance of the signal transmission transistor 321 through which the RF signal passes. The ON-resistance of the signal transmission transistor 321 decreases as a gate-source voltage increases. In the configuration of FIG. 7, in a state in which the signal transmission transistor 321 is ON, the voltage VE (e.g., 0V) equal to the ground voltage is applied to both of a gate and to a source. Because of this, there exists a problem that the gate-source voltage becomes 0V, and the passing characteristic in the pass-through mode is low (gain is low).

In recent years, development for lowering a power supply voltage of a set product has been progressing. To improve the passing characteristic in the pass-through mode via a MOS transistor such as the signal transmission transistor 321, it is required that lowering of the power supply voltage be addressed.

To achieve the above object, according to an aspect of the present invention, there is provided an amplifier with pass-through mode comprising: a ground terminal maintained in a ground potential; a power supply terminal applied with a power supply voltage; a signal input terminal to which an input signal is fed from a previous-stage circuit via a DC cut-off capacitor; a signal output terminal through which an output signal is fed to a subsequent-stage circuit via a DC cut-off capacitor; an amplification circuit including a load impedance element and a first amplification transistor, the first amplification transistor being configured such that the input signal with a first bias voltage superposed thereon is fed to a control terminal thereof, one main terminal thereof is connected to the power supply terminal via the load impedance element, the other main terminal thereof is directly or indirectly connected to the ground terminal, and the load impedance element being configured such that the output signal derived by inverting and amplifying the input signal is taken out through an end at the one main terminal of the first amplification transistor side thereof; a DC cut-off unit which cuts off a DC component of the output signal taken out through the end at the one main terminal of the first amplification transistor side of the load impedance element and feeds the output signal to the output terminal; a first bias circuit which receives as an input a mode control signal indicating an amplification mode or a pass-through mode, generates the first bias voltage for turning ON the first amplification transistor in the amplification mode, and generates the first bias voltage for turning OFF the first amplification transistor in the pass-through mode; a signal bypass circuit including a signal transmission transistor, the signal transmission transistor being applied at a control terminal thereof with a power supply voltage or a ground potential, turned OFF in the amplification mode, turned ON in the pass-through mode, one main terminal of the signal transmission transistor being connected to the output terminal and the input signal with the first bias voltage superposed thereon being fed to the other main terminal of the signal transmission transistor; and a second bias circuit including a bias control transistor and a high impedance element, the bias control transistor being applied at a control terminal thereof with a power supply voltage or a ground potential, turned OFF in the amplification mode, turned ON in the pass-through mode, one main terminal of the bias control transistor being connected to the output terminal, and the other main terminal of the bias control transistor being connected to the ground terminal via the high impedance element.

In accordance with this configuration, it is possible to implement a common emitter amplification circuit or a common source amplification circuit which is capable of switching between the amplification mode and the pass-through mode according to an electric field intensity of a received signal. In the pass-through mode, the first bias circuit feeds the first bias voltage for turning OFF the first amplification transistor to the amplification circuit. Therefore, the first amplification transistor is turned OFF and the input signal fed to the input terminal is fed to the signal bypass circuit by bypassing the amplification circuit. At this time, the signal transmission transistor is turned ON and the bias control transistor in the second bias circuit is turned ON. Because of this, the voltage of the output terminal is maintained in the ground potential via the bias control transistor and the resistor, the power supply voltage is applied to the control terminal of the signal transmission transistor, and the one main terminal of the signal transmission transistor is maintained in the ground potential, so that the ON-resistance of the signal transmission transistor is decreased to a minimum level. Therefore, the passing characteristic in the pass-through mode is improved. In addition, even when the power supply voltage is lowered, degradation of the passing characteristic in the pass-through mode is suppressed.

In the amplifier with pass-through mode, the amplification circuit further may include a second amplification transistor configured such that one main terminal thereof is connected to the load impedance element, the other main terminal thereof is connected to one main terminal of the first amplification transistor, and a second bias voltage is fed to a control terminal thereof; and the first bias circuit may generate the second bias voltage for turning ON the second amplification transistor in the amplification mode, and generates the second bias voltage for turning OFF the second amplification transistor in the pass-through mode.

In accordance with this configuration, it is possible to implement a cascode connection amplification circuit capable of switching between the amplification mode and the pass-through mode according to an electric field intensity of a received signal. As a result, the passing characteristic in the pass-through mode is improved, and lowering of the power supply voltage is addressed.

In the amplifier with pass-through mode, an impedance of the high impedance element may be higher than an output impedance of the previous-stage circuit and an input impedance of the subsequent-stage circuit.

In the amplifier with pass-through mode, the high impedance element may be a resistor.

In accordance with these configuration, in the pass-through mode, the ON-resistance and gain of the signal transmission transistor can be improved without negatively affecting the output impedance of the subsequent-stage circuit.

In the amplifier with pass-through mode, the other main terminal of the first amplification transistor may be connected to the ground terminal via a gain adjustment impedance element.

In accordance with this configuration, gain of the amplification circuit in the amplification mode can be stabilized according to the impedance of the gain adjustment impedance element.

In the amplifier with pass-through mode, the load impedance element and the gain adjustment impedance element may be coils, respectively.

In accordance with this configuration, it is possible to implement a narrow-band amplifier (low-noise amplifier) capable of switching between the amplification mode and the pass-through mode according to an electric field intensity of a received signal. As a result, the passing characteristic in the pass-through mode is improved, and lowering of the power supply voltage is addressed.

In the amplifier with pass-through mode, the load impedance element and the gain adjustment impedance element may be resistors, respectively.

In accordance with this configuration, it is possible to implement a broad-band amplifier capable of switching between the amplification mode and the pass-through mode according to an electric field intensity of a received signal. As a result, the passing characteristic in the pass-through mode is improved, and lowering of the power supply voltage is addressed.

The above and further objects, features and advantages of the present invention will more fully be apparent from the following detailed description of preferred embodiments with accompanying drawings.

DETAILED DESCRIPTION OF THE PREFERRED EMBODIMENTS

Hereinafter, preferred embodiments of the present invention will be described with reference to the drawings. Throughout the drawings, the same or corresponding components are designated by the same reference symbols and will not be described in repetition.

In claims and specification, the term "main terminal" refers to two terminals through which an operating current flows, for example, a source and a drain in an electric field transistor and an emitter and a collector in a bipolar transistor. In claims and specification, the term "control terminal" refers to a terminal applied with a bias voltage, for example, a gate in the field effect transistor, and a base in the bipolar transistor.

(Embodiment 1)

[Configuration of Amplifier with Pass-Through Mode]

Figure 1:
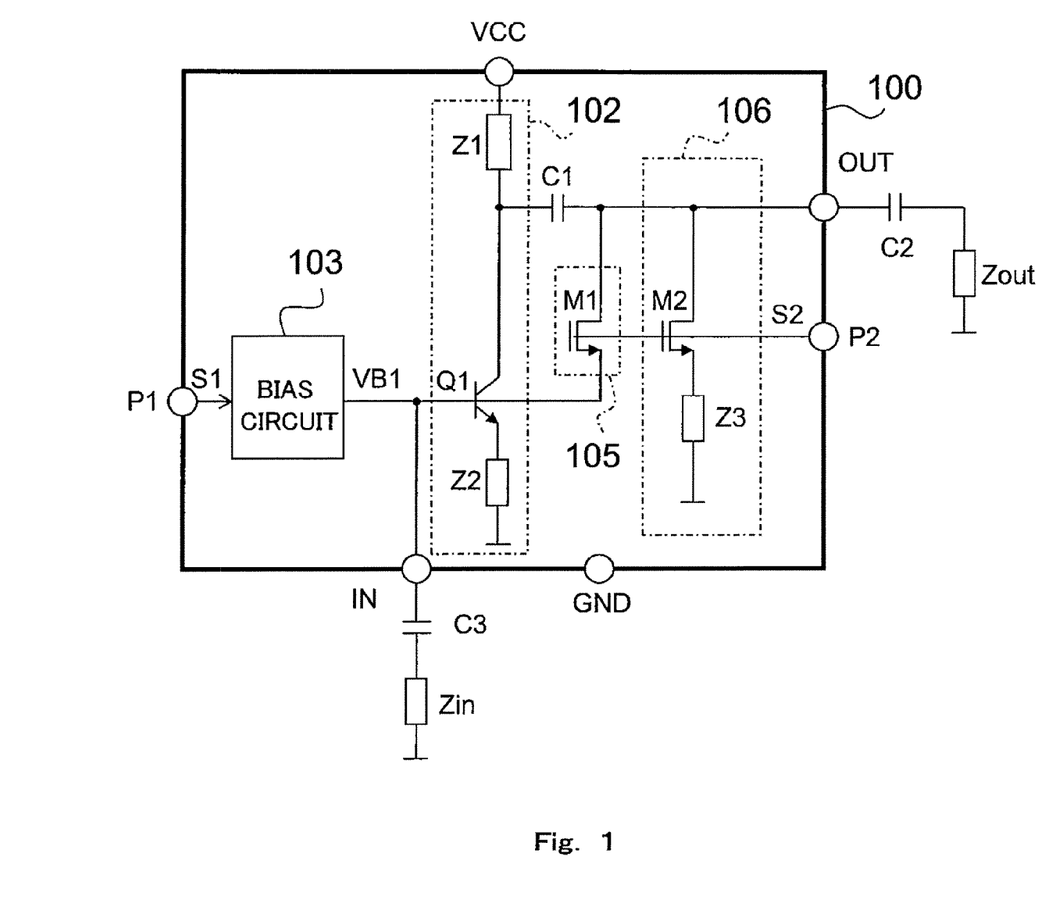
FIG. 1 is a circuit diagram showing a configuration of an amplifier with pass-through mode according to Embodiment 1 of the present invention.

FIG. 1 is a circuit diagram showing a configuration of an amplifier with pass-through mode according to Embodiment 1 of the present invention.

Referring to FIG. 1, an amplifier 100 with pass-through mode is an amplifier which is built into, for example, a front end LSI of an electronic device having a radio communication function, etc., and is switchable between an amplification mode (high-gain mode) and a pass-through mode (low-gain mode) according to an electric field intensity of a received signal.

The amplifier 100 with pass-through mode includes a signal input terminal IN, a power supply terminal VCC, a ground terminal GND, a control terminal P1, a control terminal P2, and a signal output terminal OUT.

The signal input terminal IN is connected to a desired previous-stage circuit via an outside DC cut-off capacitor C3, and receives an input signal such as a RF (radio frequency) signal from the previous-stage circuit via the outside DC cut-off capacitor C3. In FIG. 1, an output impedance of the previous-stage circuit is depicted as Zin. The signal output terminal OUT is connected to a desired subsequent-stage circuit via an outside DC cut-off capacitor C2. The input signal (output signal) which has been subjected to amplification or pass-through is output to the subsequent-stage circuit via the outside DC cut-off capacitor C2. In FIG. 1, an input impedance in the subsequent-stage circuit is depicted as Zout.

The power supply terminal VCC is connected to a positive voltage source (not shown) for actuating the amplifier 100 with pass-through mode and applied with a power supply voltage VCC from the positive voltage source. A range of the power supply voltage VCC is 1.2V~1.8V lower than a voltage in a conventional circuit. The ground terminal GND is a terminal maintained in a ground potential which is a reference of the power supply voltage VCC.

The control terminal P1 is a terminal to which a mode control signal S1 for switching a level of a base bias voltage VB1 fed from a bias circuit 103 to an amplification circuit 102 is input. In the present embodiment, when a voltage of the mode control signal S1 is Low level, the amplification mode is executed, while when the voltage of the mode control signal S1 is High level, the pass-through mode is executed.

The control terminal P2 is a terminal to which a mode control signal S2 for switching between the amplification mode and the pass-through mode is input. In the present embodiment, when a voltage of the mode control signal S2 is a ground potential, the amplification mode is executed, while when the voltage of the mode control signal S2 is the power supply voltage VCC, the pass-through mode is executed. The control terminal P1 and the control terminal P2 may be combined to form one terminal.

The amplifier 100 with pass-through mode includes the amplification circuit 102, the bias circuit 103 (first bias circuit), a DC cut-off capacitor C1, a signal bypass circuit 105 and a bias circuit 106 (second bias circuit).

The amplification circuit 102 amplifies the input signal fed to the signal input terminal IN and outputs the amplified signal in the amplification mode. In the present embodiment, the amplification circuit 102 is constituted as a common emitter (grounded emitter) amplification circuit including a load impedance element Z1, a NPN transistor Q1 (first amplification transistor), and a gain adjustment impedance element Z2.

More specifically, the input signal is superposed on the base bias voltage VB1 from the bias circuit 103 and fed to a base (control terminal) of the NPN transistor Q1. A collector (one main terminal) of the NPN transistor Q1 is connected to the power supply terminal VCC via the load impedance element Z1, and an emitter (the other main terminal) of the NPN transistor Q1 is connected to a ground terminal GND via the gain adjustment impedance element Z2. An output signal derived by inverting and amplifying the input signal is taken out from the collector side of the NPN transistor Q1, and output through the output terminal OUT via the DC cut-off capacitor C1. Alternatively, the gain adjustment impedance element Z2 may be omitted and the emitter of the NPN transistor Q1 may be directly connected to the ground terminal GND. However, by providing the gain adjustment impedance element Z2, a gain in the amplification circuit in the amplification mode is stabilized according to an impedance of the gain adjustment impedance element Z2.

The bias circuit 103 feeds the base bias voltage VB1 (first bias voltage) to the base of the NPN transistor Q1 constituting the amplification circuit 102. The bias circuit 103 receives as an input the mode control signal S1 input to the control terminal P1. When the voltage of the mode control signal S1 is Low level indicating the amplification mode, the bias circuit 103 generates the base bias voltage VB1 (0.7V or greater) for turning ON the NPN transistor Q1. On the other hand, when the voltage of the mode control signal S1 is High level indicating the pass-through mode, the bias circuit 103 generates the base bias voltage VB1 (greater than 0V and less than 0.7V) which does not turn ON the NPN transistor Q1.

The signal bypass circuit 105 leads the input signal fed to the signal input terminal IN to the output terminal OUT by bypassing the amplification circuit 102 in the pass-through mode. In the present embodiment, the signal bypass circuit 105 is constituted by a NMOS transistor M1 (signal transmission transistor).

More specifically, a gate (control terminal) of the NMOS transistor M1 is connected to the control terminal P2, a drain (one main terminal) of the NMOS transistor M1 is connected to the output terminal OUT, and a source (the other main terminal) of the NMOS transistor M1 is connected to the signal input terminal IN. The NMOS transistor M1 is a symmetric transistor which changes a positional relationship between the drain and the source with respect to the gate, according to a gate voltage. When the voltage of the mode control signal S2 is the ground potential indicating the amplification mode, the NMOS transistor M1 is OFF, while when the voltage of the mode control signal S2 is the power supply voltage VCC indicating the pass-through mode, the NMOS transistor M1 is ON.

The bias circuit 106 maintains the voltage of the output terminal OUT in a ground potential based on the voltage of the mode control signal S2 input to the control terminal P2 in the pass-through mode, thereby maximizing a gate bias (gate-source voltage Vgs) of the NMOS transistor M1 to "power supply voltage VCC–ground potential GND". In the present embodiment, the bias circuit 106 includes a NMOS transistor M2 (bias control transistor) and a high impedance element Z3.

More specifically, a gate of the NMOS transistor M2 is connected to the control terminal P2, a drain of the NMOS transistor M2 is connected to the output terminal OUT, and a source of the NMOS transistor M2 is connected to a ground GND via the high impedance element Z3. When the voltage of the mode control signal S2 is the ground potential indicating the amplification mode, the NMOS transistor M2 is OFF, while when the voltage of the mode control signal S2 is the power supply voltage VCC indicating the pass-through mode, the NMOS transistor M2 is ON.

[Passing Characteristic in Pass-Through Mode]

Figure 2A:
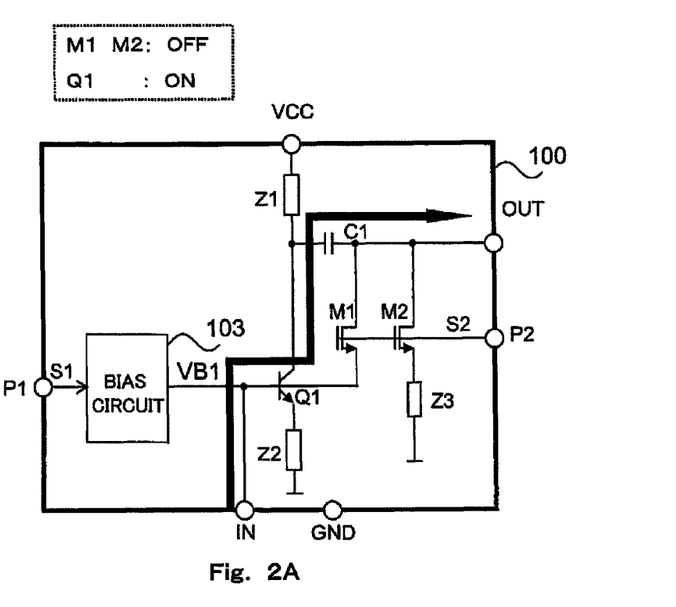
FIG. 2A is a view showing a flow of an input signal in an amplification mode.
Figure 2B:
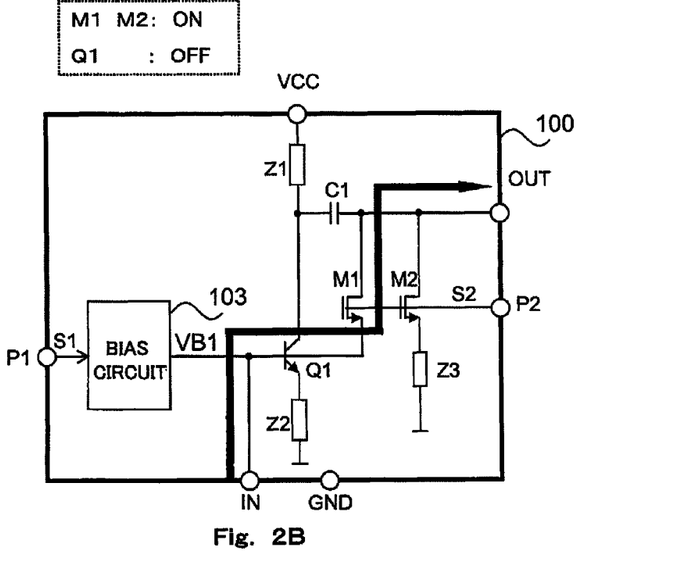
FIG. 2B is a view showing a flow of an input signal in a pass-through mode.

FIGS. 2A and 2B are views showing an operation of the amplifier 100 with pass-through mode shown in FIG. 1. FIG. 2A is a view showing a flow of the input signal in the amplification mode. FIG. 2B is a view showing a flow of the input signal in the pass-through mode.

In the case of the amplification mode of FIG. 2A, the NPN transistor Q1 is ON, and the NMOS transistors M1 and M2 are OFF. As a result of this, the amplification circuit 102 including the NPN transistor Q1 and the load impedance element Z1 amplifies the input signal fed to the input terminal IN and then feeds the amplified signal to the output terminal OUT via the DC cut-off capacitor C1.

In the case of the pass-through mode of FIG. 2B, the NPN transistor Q1 is OFF, and the NMOS transistors M1 and M2 are ON. As a result of this, the input signal fed to the input terminal IN is led to the output terminal OUT via the NMOS transistor M1 by bypassing the amplification circuit 102. At this time, the NMOS transistor M2 is ON, and therefore a voltage of the output terminal OUT becomes a ground potential. Therefore, a gate bias voltage (gate-source voltage Vgs) of the NMOS transistor M1 becomes "power supply voltage–ground potential GND".

A gain G of the amplifier 100 with pass-through mode in the pass-through mode is expressed as the following formula, when an output impedance of a previous-stage circuit connected to the signal input terminal IN is Zin, an input impedance of a subsequent-stage circuit connected to the signal output terminal OUT is Zout, and an ON-resistance of the NMOS transistor M1 is Ron, and if the outside DC cut-off capacitors C2 and C3 are not considered:

$$G = Zin \times Zout / (Zout + Ron)^2 \quad \text{(formula 1).}$$

That is, in order to increase (0 dB at maximum) the gain G in the pass-through mode, it is necessary to decrease the ON-resistance Ron of the NMOS transistor M1. The ON-resistance Ron of the NMOS transistor M1 is decreased when the gate-source voltage Vgs is increased, because the ON-resistance Ron of the NMOS transistor M1 is inversely proportional to the gate-source voltage Vgs.

If the bias circuit 106 does not exist, the gate-source voltage Vgs of the NMOS transistors M1 becomes "power supply voltage VCC–base bias voltage VB1 (greater than 0V and less than 0.7V)". Therefore, the ON-resistance Ron of the NMOS transistor M1 is expressed as the following formula:

$$Ron = \alpha / (VCC - VB1) \quad \text{(formula 2)}$$

By comparison, in the case where the bias circuit 106 is provided as shown in FIG. 1, the gate-source voltage Vgs of the NMOS transistors M1 becomes "power supply voltage VCC–ground potential GND." Therefore, the ON-resistance Ron of the NMOS transistor M1 is expressed as the following formula:

$$Ron = \alpha / (VCC - GND) \quad \text{(formula 3)}$$

On the basis of a comparison made between (formula 2) and (formula 3), in a case where the power supply voltage VCC is 1.2V, and the base bias voltage VB1 in the pass-through mode is 0.3V, the ON-resistance Ron of the NMOS transistor M1 is "$\alpha/0.9$" according to the formula (2) and "$\alpha/1.2$" according to the formula (3).

In the pass-through mode, the bias circuit 106 is actuated, the gate bias (gate-source voltage Vgs) of the NMOS transistors M1 is increased from "power supply voltage VCC–base bias voltage VB1" up to "power supply voltage VCC–ground potential GND" with a maximum level, and hence the ON-resistance Ron of the NMOS transistor M1 is decreased to a minimum level. Because of this, even when the power supply voltage VCC is lowered, degradation of the passing characteristic in the pass-through mode can be suppressed.

[Modified Example]

The amplification circuit 102 may constitute a common emitter amplification circuit by replacing the NPN transistor Q1 by a PNP transistor and by forming a circuit configuration adapted to a characteristic of the PNP transistor. Or, the amplification circuit 102 may constitute a common source (grounded source) amplification circuit by replacing the NPN transistor Q1 by a NMOS transistor or a PMOS transistor (as in the case of the PNP transistor, formation of a circuit configuration adapted to a characteristic of the PMOS transistor is necessary).

The bias circuit 103 may generate the base bias voltage VB1 based on a reference voltage generated by a band gap regulator (not shown).

The signal bypass circuit 105 may be implemented by using a PMOS transistor as substitute for the NMOS transistor M1 and forming a circuit configuration adapted to the PMOS transistor. The bias circuit 106 may implemented by replacing the NMOS transistor M2 by the PMOS transistor and forming a circuit configuration adapted to the PMOS transistor.

(Embodiment 2)

[Configuration of Amplifier with Pass-Through Mode]

Figure 3:
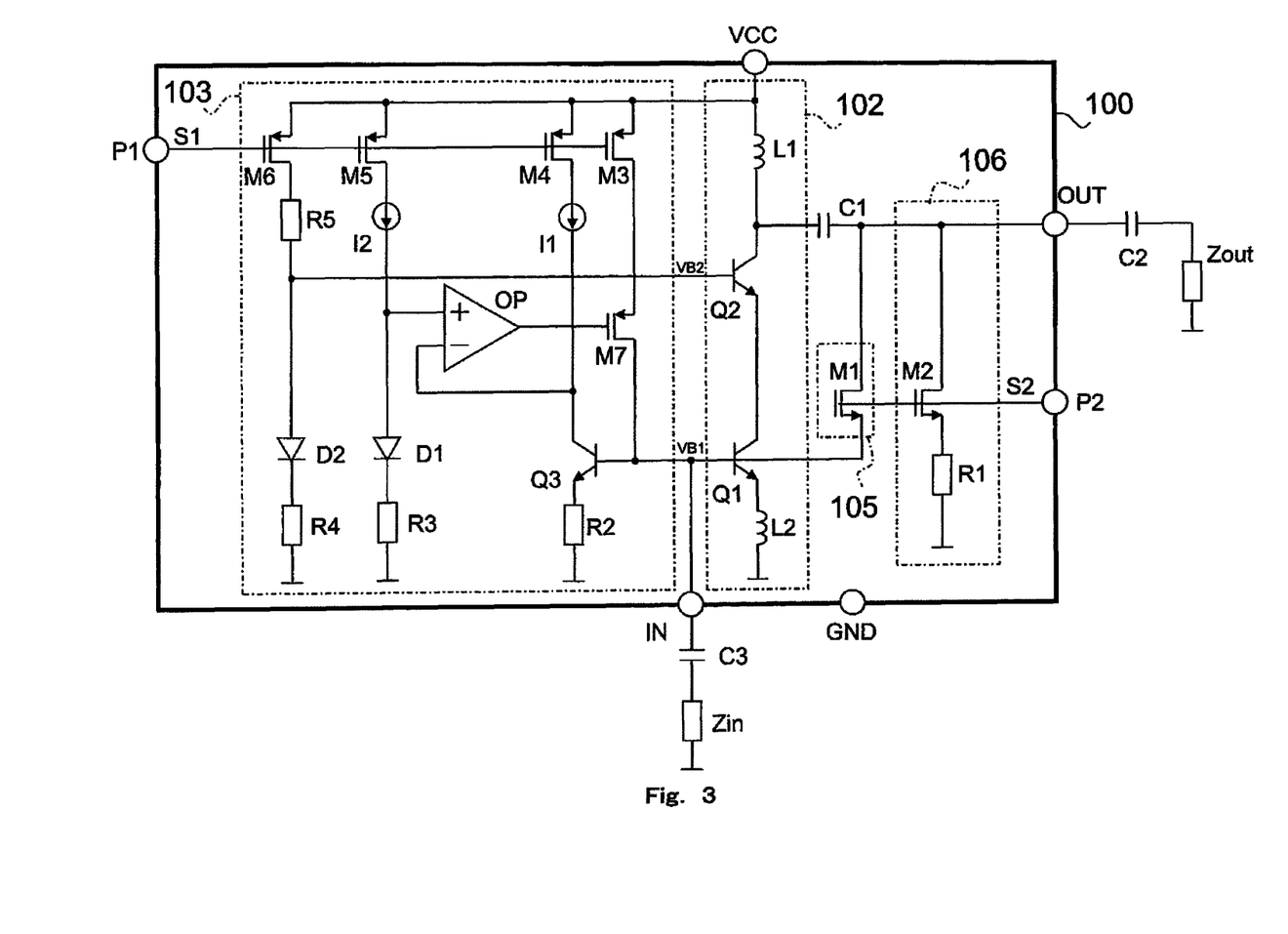
FIG. 3 is a circuit diagram showing a configuration of an amplifier with pass-through mode according to Embodiment 2 of the present invention.

FIG. 3 is a circuit diagram showing a configuration of an amplifier with pass-through mode according to Embodiment 2 of the present invention. Referring to FIG. 3, an amplifier 100 with pass-through mode is constituted by a low-noise amplifier of a narrow-band cascode connection type, and can achieve the advantages achieved by the configuration of FIG. 1.

More specifically, in the configuration of FIG. 3, a coil L1 is used as the load impedance element Z1 in the configuration of FIG. 1, a coil L2 is used as the gain adjustment impedance element Z2 in the configuration of FIG. 1, and a resistor R1 is used as the high impedance element Z3 in the configuration of FIG. 1. The amplifier 100 with pass-through mode in FIG. 3 further includes a NPN transistor Q2 (second amplification transistor) between the coil L1 and a collector (one main terminal) of the NPN transistor Q1 (first amplification transistor).

A base of the NPN transistor Q2 is connected to a ground terminal via a diode D2 and a resistor R4 in the bias circuit 103. On the basis of the base of the NPN transistor Q2, the NPN transistor Q2 constitutes a common base (grounded base) amplification circuit. Therefore, the amplification circuit 102 is constituted by a cascode connection amplification circuit in which the common emitter amplification circuit of the NPN transistor Q1 and the common base amplification circuit of the NPN transistor Q2. The cascode connection amplification circuit can lessen reduction (mirror effect) of a frequency characteristic associated with a base-collector capacitance as compared to the amplification circuit 102 including only the common emitter amplification circuit.

By using the coil L1 as the load impedance element Z1, the amplification circuit 102 can be used in a narrow band. This is advantageous to lowering of a power supply voltage as compared to a case where a resistor which causes a heat noise due to a voltage drop when a current flows therethrough is used.

By using the coil L2 as the gain adjustment impedance element Z2 between the emitter of the NPN transistor Q1 and the ground terminal GND, the amplification circuit 102 implements a low-noise amplifier (LNA) which amplifies a weak input signal with a low noise level. The coil L2 corresponds to an emitter resistor for improving linearity, stability and a noise characteristic.

A resistance value of the resistor R1 which is the high impedance element Z3 is set to a value which is about two-hundreds times as great as a value of the output impedance Zin of the previous-stage circuit and a value of the input impedance Zout of the subsequent-stage circuit. As a result, in the case of the pass-through mode, the ON-resistance and gain of the NMOS transistor M1 can be improved without negatively affecting the output impedance Zout of the subsequent-stage circuit.

The bias circuit 103 includes a first base bias unit for generating the base bias voltage VB1 (first bias voltage) fed to the base of the NPN transistor Q1, and a second base bias unit for generating the base bias voltage VB2 (second bias voltage) fed to the base of the NPN transistor Q2.

In the first base bias unit, between a power supply terminal VCC and a ground terminal GND, a PMOS transistor M5, a current source I2, a diode D1, and a resistor R3 are connected in series, and an anode voltage of the diode D1 is applied to a non-inverting input terminal of an operation amplifier OP. In addition, between the power supply terminal VCC and the ground terminal GND, a PMOS transistor M4, a current source I1 a NPN transistor Q3, and a resistor R2 are connected in series, and a collector voltage of the NPN transistor Q3 is applied to an inverting input terminal of the operation amplifier OP. A base of the NPN transistor Q3 is connected to the NPN transistor Q1 and the input terminal IN.

Between the power supply terminal VCC and the base of the NPN transistor Q3, PMOS transistors M3 and M7 are connected in series. Gates of the PMOS transistors M3 to M5 are connected to the control terminal P1, while a gate of the PMOS transistor M7 is connected to an output terminal of the operation amplifier OP.

In accordance with the above configuration, the PMOS transistors M3 to M5 are ON when a mode control signal S1 input to the control terminal P1 is Low level (amplification mode), while the PMOS transistors M3 to M5 are OFF when the mode control signal S1 input to the control terminal P1 is High level (pass-through mode). When the PMOS transistors M3 to M5 are ON, a negative feedback of the operation amplifier OP occurs, so that a stable base bias voltage VB1 (base current) is fed to the base of the NPN transistor Q1. More specifically, when a base current in the NPN transistor Q1 increases, the voltage applied to the inverting input terminal of the operation amplifier OP decreases, and a voltage fed from the operation amplifier OP to a gate of a PMOS transistor M7 increases, so that a base current in the NPN transistor Q1 decreases gradually. On the other hand, if the base current in the NPN transistor Q1 decreases, the voltage applied to the inverting input terminal of the operation amplifier OP increases, and the voltage fed from the operation amplifier OP to the gate of the PMOS transistor M7 decreases, so that the base current in the NPN transistor Q1 increases gradually. On the other hand, when the PMOS transistors M3 to M5 are OFF, a base-emitter voltage Vbe (about 0.6V) in the NPN transistor Q3 is applied to the base of the NPN transistor Q1.

In the second base bias unit, between the power supply terminal VCC and the ground terminal GND, a PMOS transistor M6, a resistor R5, a diode D2, and a resistor R4 are connected in series. A gate of the PMOS transistor M6 is connected to the control terminal P1. An anode voltage of the diode D2 is fed to a base of the NPN transistor Q2 as a base bias voltage VB2.

In accordance with the above configuration, the PMOS transistor M6 is ON when the mode control signal S1 input to the control terminal P1 is Low level (amplification mode), while the PMOS transistor M6 is OFF when the mode control signal S1 input to the control terminal P1 is High level (pass-through mode). When the PMOS transistor M6 is ON, the base bias voltage VB2 is fed to the base of the NPN transistor Q2. On the other hand, when the PMOS transistor M6 is OFF, the base of the NPN transistor Q2 is electrically grounded (becomes ground potential) via the diode D2 and the resistor R4.

[Modified Example]

Figure 4:
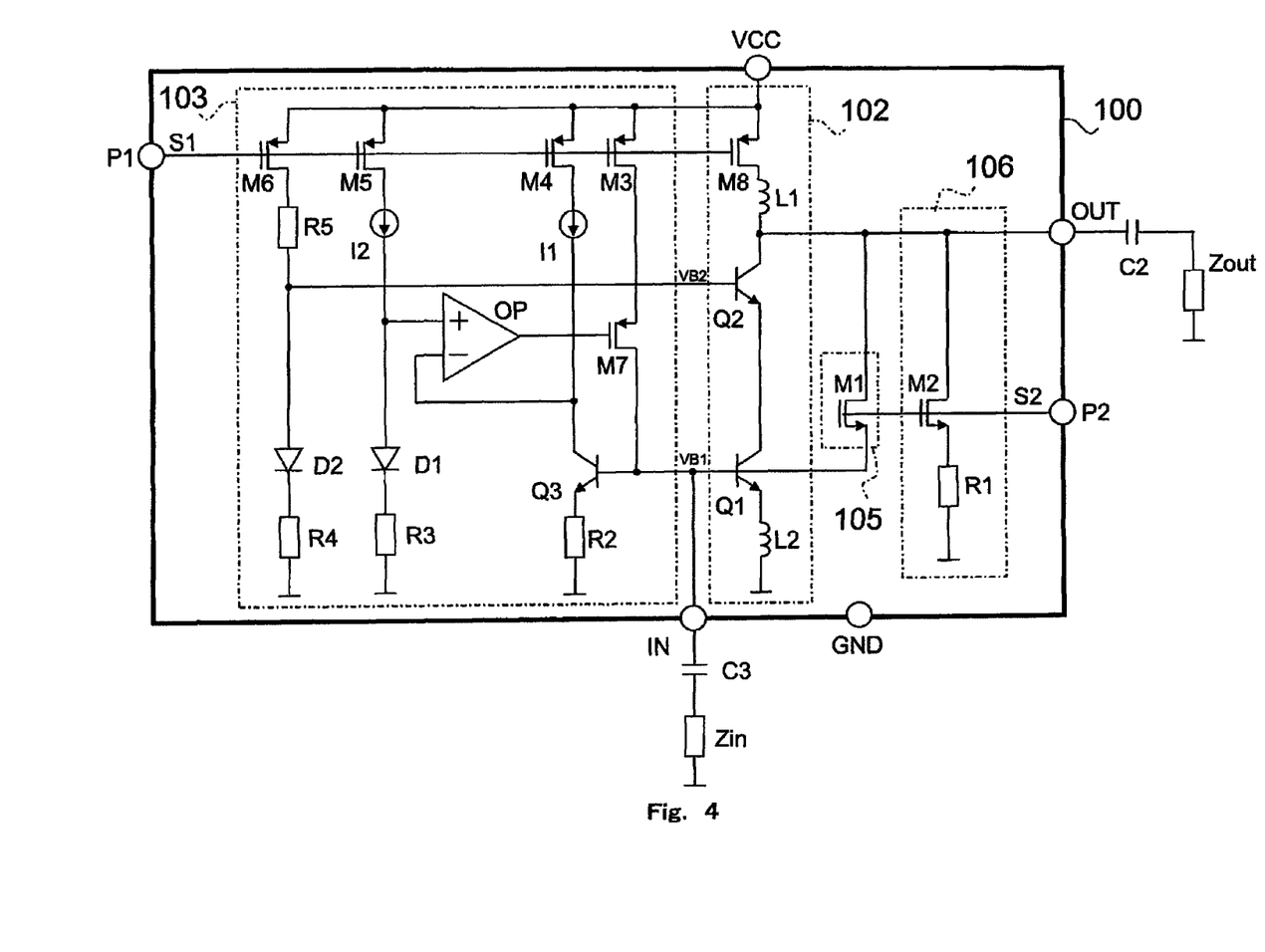
FIG. 4 is a circuit diagram showing a configuration of an amplifier with pass-through mode according to a modified example of Embodiment 2 of the present invention.

FIG. 4 is a circuit diagram showing a configuration of an amplifier with pass-through mode according to a modified example of Embodiment 2 of the present invention.

An amplifier 100 with pass-through mode of FIG. 4 is identical to the amplifier 100 with pass-through mode of FIG. 3 except that the DC cut-off capacitor C1 provided between the collector (one main terminal) of the NPN transistor Q2 and the output terminal OUT in the configuration of FIG. 3 is replaced by a PMOS transistor M8 provided between the power supply terminal VCC and the coil L1.

A gate of the PMOS transistor M8 is connected to the control terminal P1. The PMOS transistor M8 is ON when the mode control signal S1 input to the control terminal P1 is Low level (amplification mode), while the PMOS transistor M8 is OFF when the mode control signal S1 input to the control terminal P1 is High level (pass-through mode). When the PMOS transistor M8 is OFF, a DC component of a collector voltage of the NPN transistor Q2 is fixed in a ground potential and cut off. Therefore, the PMOS transistor M8 serves as the DC cut-off capacitor C1.

As a modified example except the configuration of FIG. 4, Embodiment 2 may be modified like the modified example of Embodiment 1. The high-impedance element Z3 may be a coil.

(Embodiment 3)
[Configuration of Amplifier with Pass-Through Mode]

Figure 5:
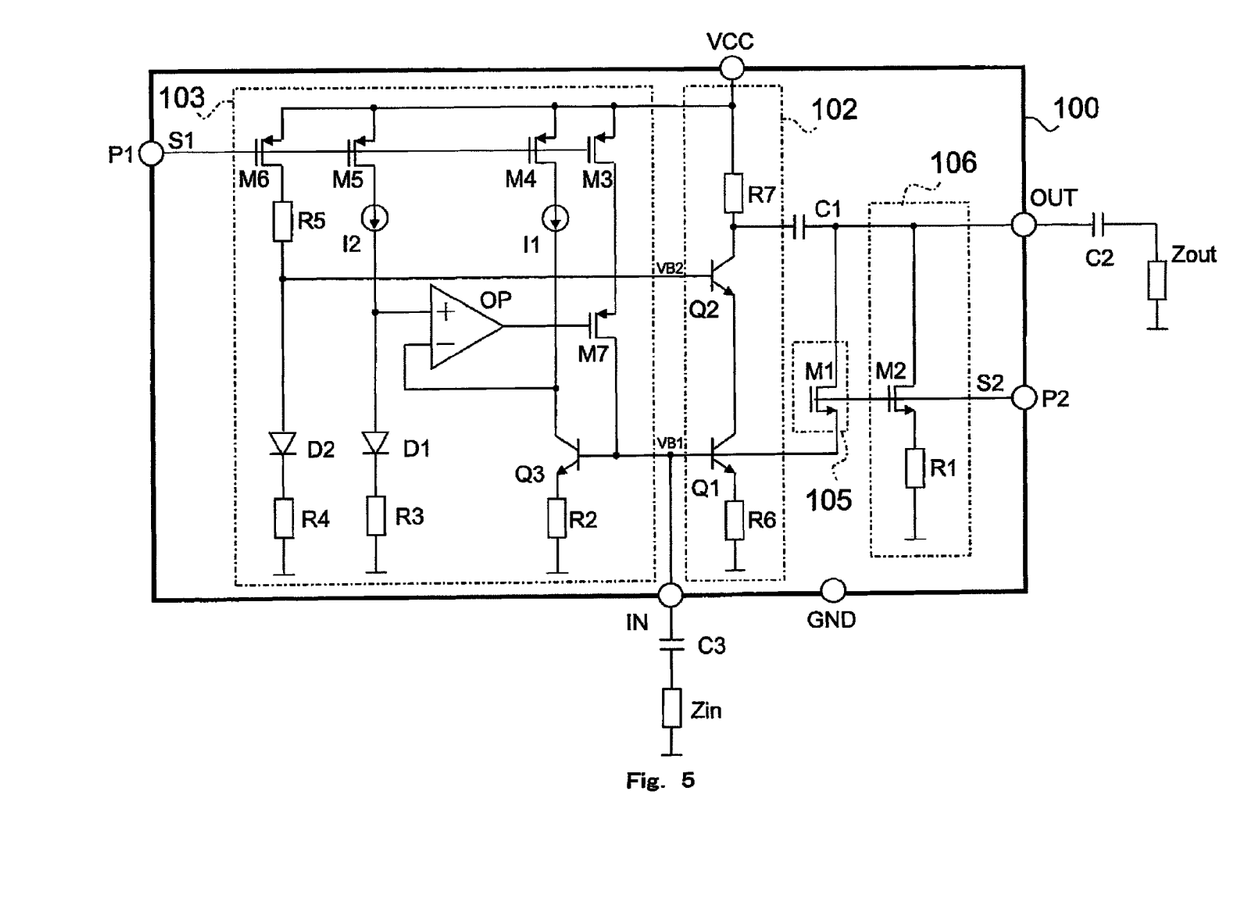
FIG. 5 is a circuit diagram showing a configuration of an amplifier with pass-through mode according to Embodiment 3 of the present invention.

FIG. 5 is a circuit diagram showing a configuration of an amplifier with pass-through mode according to Embodiment 3 of the present invention.

An amplifier 100 with pass-through mode of FIG. 5 is identical to the amplifier 100 with pass-through mode of FIG. 3 except that the coil L1 as the load impedance element Z1 in the configuration of FIG. 3 is replaced by a resistor R7 and the coil L2 as the gain adjustment impedance element Z2 in the configuration of FIG. 3 is replaced by a resistor R6. That is, the amplifier 100 with pass-through mode of FIG. 5 is configured as an amplifier of a broad-band cascode connection type, and can achieve the same advantages as those achieved by the configuration of FIG. 3.

[Modified Example]

Figure 6:
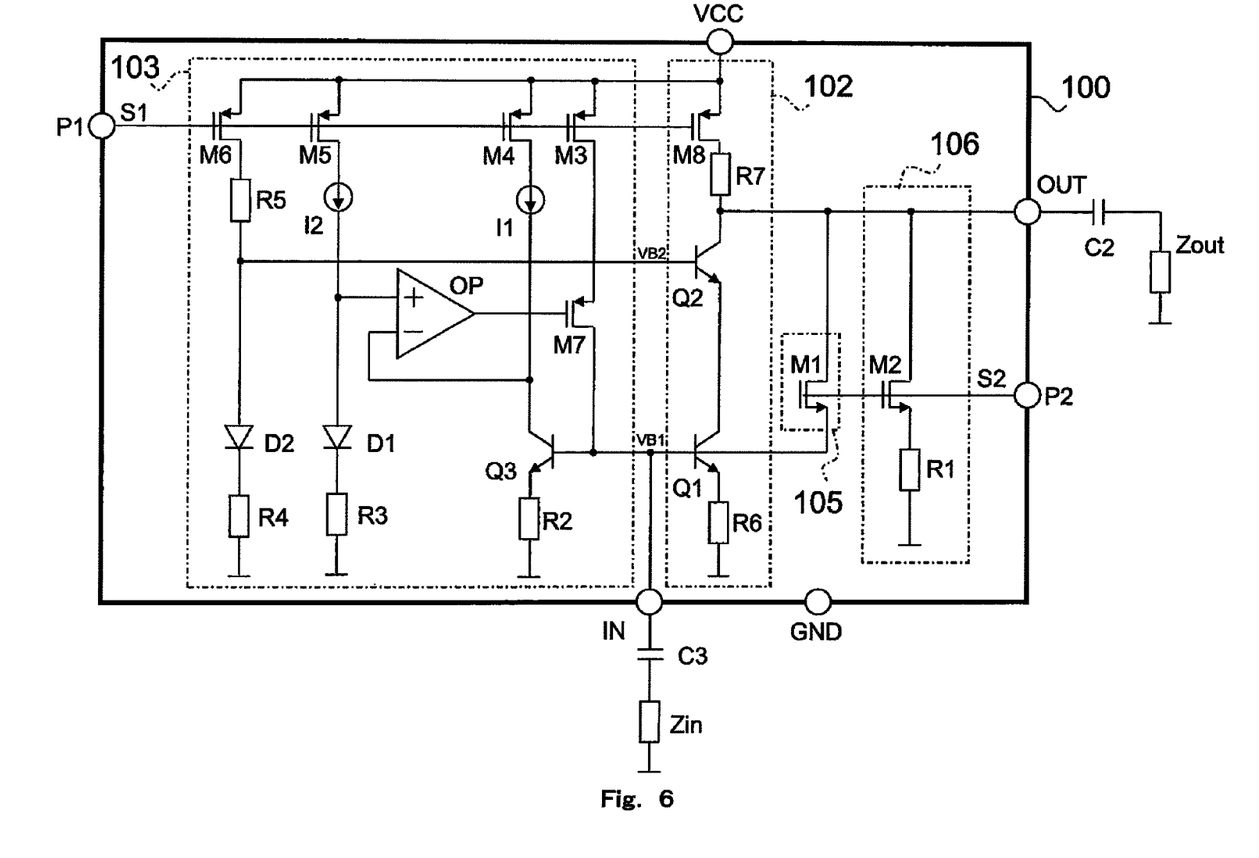
FIG. 6 is a circuit diagram showing a configuration of an amplifier with pass-through mode according to a modified example of Embodiment 3 of the present invention.

FIG. 6 is a circuit diagram showing a configuration of an amplifier with pass-through mode according to a modified example of Embodiment 3 of the present invention.

An amplifier 100 with pass-through mode of FIG. 6 is identical to the amplifier with pass-through mode 100 of FIG. 5 except that the DC cut-off capacitor C1 provided between the collector (one main terminal) of the NPN transistor Q2 and the output terminal OUT in the configuration of FIG. 5 is replaced by a PMOS transistor M8 provided between the power supply terminal VCC and the coil L1.

As a modified example except the configuration of FIG. 6, Embodiment 3 may be modified like the modified example of Embodiment 1. The high-impedance element Z3 may be a coil.

The amplifier with the pass-through mode of the present invention is useful as a RF amplification circuit provided at an input device of a radio communication device operating at a low power supply voltage, etc.

Numeral modifications and alternative embodiments of the present invention will be apparent to those skilled in the art in view of the foregoing description. Accordingly, the description is to be construed as illustrative only, and is provided for the purpose of teaching those skilled in the art the best mode of carrying out the invention. The details of the structure and/or function may be varied substantially without departing from the spirit of the invention.

What is claimed is:

1. An amplifier with pass-through mode comprising:
   a ground terminal maintained in a ground potential;
   a power supply terminal applied with a power supply voltage;
   signal input terminal to which an input signal is fed from a previous-stage circuit via a DC cut-off capacitor;
   a signal output terminal through which an output signal is fed to a subsequent-stage circuit via a DC cut-off capacitor;
   an amplification circuit including a load impedance element and a first amplification transistor, the first amplification transistor being configured such that the input signal with a first bias voltage superposed thereon is fed to a control terminal thereof, one main terminal thereof is connected to the power supply terminal via the load impedance element, the other main terminal thereof is directly or indirectly connected to the ground terminal, and the load impedance element being configured such that the output signal derived by inverting and amplifying the input signal is taken out through an end at the one main terminal of the first amplification transistor side thereof;
   a DC cut-off unit which cuts off a DC component of the output signal taken out through the end at the one main terminal of the first amplification transistor side of the load impedance element and feeds the output signal to the output terminal;
   a first bias circuit which receives as an input a mode control signal indicating an amplification mode or a pass-through mode, generates the first bias voltage for turning ON the first amplification transistor in the amplification mode, and generates the first bias voltage for turning OFF the first amplification transistor in the pass-through mode;
   a signal bypass circuit including a signal transmission transistor, the signal transmission transistor being applied at a control terminal thereof with a power supply voltage or a ground potential, turned OFF in the amplification mode, turned ON in the pass-through mode, one main terminal of the signal transmission transistor being connected to the output terminal and the input signal with the first bias voltage superposed thereon being fed to the other main terminal of the signal transmission transistor; and
   a second bias circuit including a bias control transistor and a high impedance element, the bias control transistor being applied at a control terminal thereof with a power supply voltage or a ground potential, turned OFF in the amplification mode, turned ON in the pass-through mode, one main terminal of the bias control transistor being connected to the output terminal, and the other main terminal of the bias control transistor being connected to the ground terminal via the high impedance element.

2. The amplifier with pass-through mode according to claim 1,
   wherein the amplification circuit further includes a second amplification transistor configured such that one main terminal thereof is connected to the load impedance element, the other main terminal thereof is connected to one main terminal of the first amplification transistor, and a second bias voltage is fed to a control terminal thereof; and
   the first bias circuit generates the second bias voltage for turning ON the second amplification transistor in the amplification mode, and generates the second bias voltage for turning OFF the second amplification transistor in the pass-through mode.

3. The amplifier with pass-through mode according to claim 1,
   wherein an impedance of the high impedance element is higher than an output impedance of the previous-stage circuit and an input impedance of the subsequent-stage circuit.

4. The amplifier with pass-through mode according to claim 3,
   wherein the high impedance element is a resistor.

5. The amplifier with pass-through mode according to claim 1,
   wherein the other main terminal of the first amplification transistor is connected to the ground terminal via a gain adjustment impedance element.

6. The amplifier with pass-through mode according to claim 5,
   wherein the load impedance element and the gain adjustment impedance element are coils, respectively.

7. The amplifier with pass-through mode according to claim 5,
   wherein the load impedance element and the gain adjustment impedance element are resistors, respectively.

8. The amplifier with pass-through mode according to claim 2,
   wherein an impedance of the high impedance element is higher than an output impedance of the previous-stage circuit and an input impedance of the subsequent-stage circuit.

9. The amplifier with pass-through mode according to claim 8,
   wherein the high impedance element is a resistor.

* * * * *